United States Patent
Kwon et al.

(10) Patent No.: US 9,378,931 B2
(45) Date of Patent: Jun. 28, 2016

(54) PULSE PLASMA APPARATUS AND DRIVE METHOD THEREOF

(71) Applicant: Samsung Electronics Co., Ltd., Suwon-si, Gyeonggi-do (KR)

(72) Inventors: Ohyung Kwon, Seongnam-si (KR); Namjun Kang, Bucheon-si (KR); Doug-Yong Sung, Seoul (KR); Jung-hyun Cho, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/796,188

(22) Filed: Jul. 10, 2015

(65) Prior Publication Data

US 2016/0126069 A1 May 5, 2016

(30) Foreign Application Priority Data

Oct. 29, 2014 (KR) ........................ 10-2014-0148444

(51) Int. Cl.
*H01J 7/24* (2006.01)
*H01J 37/32* (2006.01)
*H05B 31/26* (2006.01)

(52) U.S. Cl.
CPC ............. *H01J 37/32183* (2013.01); *H01J 7/24* (2013.01); *H01J 37/321* (2013.01); *H01J 37/32146* (2013.01); *H05B 31/26* (2013.01); *H01J 2237/327* (2013.01); *H01J 2237/334* (2013.01)

(58) Field of Classification Search
CPC .................................. H05B 31/26; H01J 7/24
USPC .............. 315/111.21, 111.41, 111.51, 111.71
See application file for complete search history.

(56) References Cited

U.S. PATENT DOCUMENTS

| 6,759,339 B1 | 7/2004 | Choi et al. |
| 7,224,568 B2 | 5/2007 | Ishimura et al. |
| 7,625,460 B2 | 12/2009 | Howard |

(Continued)

FOREIGN PATENT DOCUMENTS

| JP | 2011198983 A | * | 10/2011 | ............ H01L 21/265 |
| JP | 2013125892 A | * | 6/2013 | .......... H01L 21/3065 |

(Continued)

OTHER PUBLICATIONS

Korean Office Action dated Apr. 4, 2016 in application No. KR 14-148444.

*Primary Examiner* — Tung X Le
(74) *Attorney, Agent, or Firm* — Harness, Dickey & Pierce, PLC

(57) ABSTRACT

A pulse plasma apparatus includes a process chamber, source RF generator configured to supply first and second level RF pulse power having first and second duty cycles to an upper electrode of the process chamber, a reflected power indicator configured to indicate reflection RF power, a first matching network, and a controller. The first matching network is configured to match an impedance of the process chamber with an impedance of the source RF generator as a first or second matching capacitance value, respectively when the first level RF pulse power or second level RF pulse power is supplied, respectively. The controller is configured to calculate a third matching capacitance value based on the first and second matching capacitance values and a ratio of the first and second duty cycles, provide the third matching capacitance values to the first matching network, and control the source RF generator and first matching network.

20 Claims, 6 Drawing Sheets

(56) References Cited

U.S. PATENT DOCUMENTS

| | | |
|---|---|---|
| 8,222,821 B2 | 7/2012 | Bai et al. |
| 8,264,154 B2 | 9/2012 | Banner et al. |
| 8,404,598 B2 | 3/2013 | Liao et al. |
| 8,471,477 B2 | 6/2013 | Tomita et al. |
| 2005/0061443 A1 | 3/2005 | Nakano et al. |
| 2007/0247074 A1* | 10/2007 | Paterson ............ H01J 37/32091 315/111.21 |
| 2009/0298287 A1 | 12/2009 | Shannon et al. |
| 2012/0262064 A1* | 10/2012 | Nagarkatti ........ H01J 37/32082 315/111.21 |
| 2013/0119017 A1 | 5/2013 | Yang et al. |
| 2013/0220549 A1 | 8/2013 | Wilson |

FOREIGN PATENT DOCUMENTS

| | | | |
|---|---|---|---|
| JP | 2015090759 A | * 5/2015 | ............... H05H 1/00 |
| KR | 20110019743 A | * 2/2011 | ............ H01J 37/321 |
| KR | 20110032961 A | 3/2011 | |
| KR | 20140105467 A | 9/2014 | |

* cited by examiner

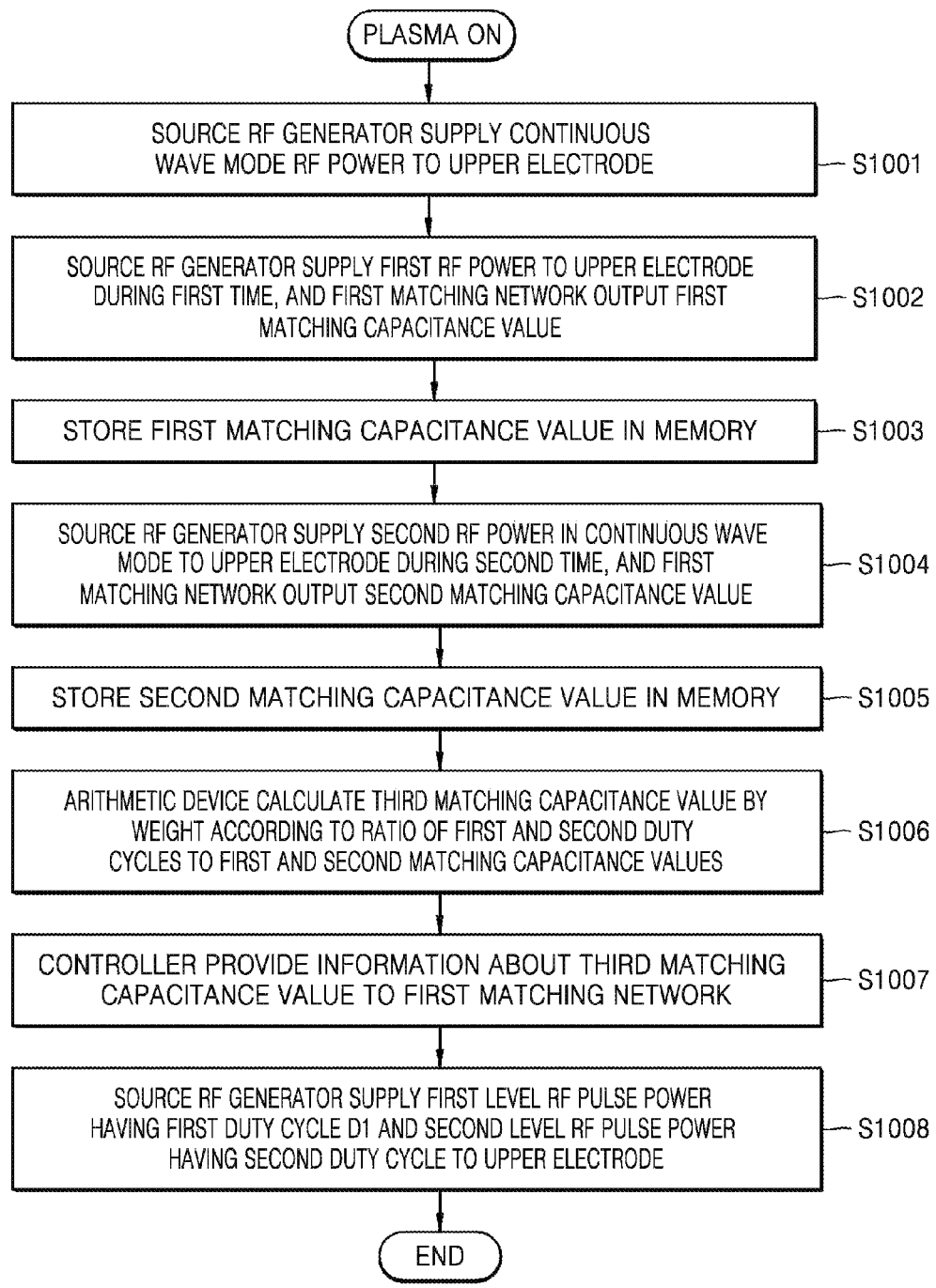

PULSE PLASMA APPARATUS AND DRIVE METHOD THEREOF

CROSS-REFERENCE TO RELATED APPLICATION

This application claims priority under 35 U.S.C. §119 to Korean Patent Application No. 10-2014-0148444, filed on Oct. 29, 2014, in the Korean Intellectual Property Office, the disclosure of which is incorporated herein in its entirety by reference.

BACKGROUND

The inventive concepts relate to a pulse plasma apparatus and/or drive method thereof, and more particularly, to a pulse plasma apparatus and/or drive method thereof. According to some of the inventive concepts, when pulse plasma power is applied in the pulse plasma apparatus performing, for example, an etching process of a semiconductor substrate, which is placed between an upper electrode and a lower electrode in a process chamber of the plasma apparatus, a reflected wave from the process chamber may be reduced or minimized by using frequency tuning of pulse plasma power.

When the etching process is performed in the semiconductor substrate or the like by using the pulse plasma apparatus, power from a radio frequency (RF) power generator or an RF power source is coupled to an electrode inside a plasma process chamber through a matching network, which is dynamically tuned. The pulse plasma power, which is applied to an electrode in the plasma process chamber, is coupled to process gases in the plasma process chamber, and forms plasma to be used in the plasma process (e.g., plasma etching process). The matching network may minimize a reflected power of the plasma process chamber and maximize the amount of the RF power (e.g., the pulse plasma power) to be coupled to process gases to form the plasma. The matching network may be typically matched to 50Ω with a complex impedance of the plasma. In order to smooth the dynamic matching according to change of plasma characteristics during the plasma process, the matching network may be continuously adjusted so as to achieve and maintain a desired matching over the entire process.

Generally, a controller configured to control the plasma process also may control the matching network. Furthermore, the controller may measure reflected power from the matching network and judge whether the reflected power from the matching network is increased. When it is determined that the reflected power is increased, the controller may adjust a capacitance or an inductance of the matching network so as to match the RF power source with the plasma in the plasma process chamber.

SUMMARY

Some of the inventive concepts provide a pulse plasma apparatus, which includes a plasma process chamber with an upper electrode and a lower electrode, and/or drive method thereof, which improve or maximize an effect of reducing power reflected from the plasma process chamber by using a frequency tuning method when pulse plasma power having a plurality of power levels that are non-zero is applied to the upper electrode.

According to an example embodiment, a pulse plasma apparatus includes a process chamber including an upper electrode and a lower electrode, a source RF generator configured to supply first level RF pulse power and second level RF pulse power, the first level RF pulse power having a first duty cycle to the upper electrode, and the second level RF pulse power having a second duty cycle to the upper electrode, a reflected power indicator configured to indicate reflection RF power, the reflection RF power being RF power re-reflected from the process chamber to the source RF generator, a first matching network configured to match a plasma impedance of the process chamber with an impedance of the source RF generator as a first matching capacitance value when the first level RF pulse power is supplied, and match the plasma impedance of the process chamber with the impedance of the source RF generator as a second matching capacitance value when the second level RF pulse power is supplied, and a controller configured to calculate a third matching capacitance value based on the first matching capacitance value, the second matching capacitance value and a ratio of the first and second duty cycles, provide the third matching capacitance value to the first matching network, and control the source RF generator and the first matching network.

In some example embodiments, the first level RF pulse power may have a smaller value than the second level RF pulse power.

In some example embodiments, the first and second duty cycles may be identical to each other, and the controller may be configured to calculate an intermediate value of the first and second matching capacitance values as the third matching capacitance value.

In some example embodiments, the pulse plasma apparatus may further includes a first bias RF generator configured to supply third level RF pulse power to the lower electrode, and a synchronization device connected to the source RF generator and the first bias RF generator and configured to synchronize the first duty cycle of the first level RF pulse power with a duty cycle of the third level RF pulse power.

In some example embodiments, the synchronization device may be configured to control the first bias RF generator such that the third level RF pulse power is not supplied to the lower electrode while the source RF generator supplies the first level RF pulse power to the upper electrode at the first duty cycle, and the synchronization device is configured to perform duty cycle synchronization by supplying the third level RF pulse power to the lower electrode at the second duty cycle while the source RF generator supplies the second level RF pulse power to the upper electrode at the second duty cycle.

In some example embodiments, the controller may include a memory configured to store the first and second matching capacitance values, and an arithmetic device configured to perform an algorithm that assigns a weight to the first and the second matching capacitance values according to the ratio of the first and second duty cycles, and calculates the third matching capacitance value that matches the plasma impedance of the process chamber with the impedance of the source RF generator.

In some example embodiments, the pulse plasma apparatus may further include a second bias RF generator configured to be connected to the lower electrode, and supply fourth RF pulse power, the fourth RF pulse power having a lower frequency than the third level RF pulse power to the lower electrode.

In some example embodiments, the source RF generator may be configured to supply the first and second level RF pulse powers at a frequency of 100 MHz to 200 MHz, the first bias RF generator may be configured to supply the third level RF pulse power at a frequency of 2 MHz to 100 MHz, and the second bias RF generator may be configured to supply fourth level RF power at a frequency of 0 MHz to 2 MHz.

According to an example embodiment, a drive control method of a pulse plasma apparatus includes supplying first RF power in a continuous wave mode to an upper electrode of a process chamber by a source RF generator during a first time period, determining a first matching capacitance value so as to match a plasma impedance of the process chamber with an impedance of the source RF generator, supplying second RF power in the continuous wave mode to the upper electrode by the source RF generator during a second time period, determining a second matching capacitance value so as to match the plasma impedance of the process chamber with the impedance of the source RF generator, calculating a third matching capacitance value by a controller based on the first matching capacitance value and the second matching capacitance value, transmitting the third matching capacitance value to the first matcher by the controller, and alternately supplying first level RF pulse power having a first duty cycle and second level RF pulse power having a second duty cycle to the upper electrode by the source RF generator.

In some example embodiments, the calculating a third matching capacitance may include calculating a ratio of the first and second duty cycles, and calculating the third matching capacitance value by applying weights according to the ratio to the first and second matching capacitance values, respectively.

In some example embodiments, the method may further include storing the first matching capacitance values in a memory; and storing the second matching capacitance values in the memory.

In some example embodiments, the supplying first RF power by the source RF generator may include supplying third RF power to a lower electrode of the process chamber during the first time period by a first bias RF generator connected to the lower electrode.

In some example embodiments, the supplying first RF power by the source RF generator may include supplying fourth RF power to the lower electrode during the first time period by a second bias RF generator connected to the lower electrode.

In some example embodiments, the method may further include synchronizing the supply of the supply of the first and third RF powers to the upper electrode and the lower electrode at the first and second duty cycles.

In some example embodiments, the first bias RF generator may not supply RF pulse power to the lower electrode while the source RF generator supplies the first level RF pulse power having the first duty cycle to the upper electrode, and the first bias RF generator may supply third level RF pulse power having the second duty cycle to the lower electrode while the source RF generator supplies the second level RF pulse power having the second duty cycle to the upper electrode.

According to an example embodiment, a pulse plasma apparatus includes a process chamber including an upper electrode and a lower electrode, a source RF generator configured to supply source RF powers to the upper electrode, the source power including first RF power in a continuous wave form during a first time period, second RF power in a continuous waver form during a second time period, and the first and second level RF pulse powers supplied in an alternating manner during a third time period, the first level RF pulse power having a first duty cycle, the second level RF pulse power having a second duty cycle, the third time period following the second time period, the second time period following the first time period, a bias RF generator configured to supply bias RF power to the lower electrode, the bias RF power having a third duty cycle, a reflected power indicator configured to indicate reflection RF power, the reflection RF power being RF power reflected from the process chamber, an impedance matching network configured to match a plasma impedance of the process chamber with an impedance of the source RF generator during the first time period and during the second time period, and a controller configured to calculate first and second matching capacitance values that match the plasma impedance of the plasma process chamber with the impedance of the source RF generator during the first and second time periods, respectively, calculate a third matching capacitance value based on the first and second matching capacitance values, and the first and second duty cycles, and control the impedance matching network based on the third matching capacitance value.

In some example embodiments, the controller may be configured to calculate the third matching capacitance by combining the first matching capacitance value multiplied by a first weight with the second matching capacitance value m by a second weight, where the first weight is a ration of the first duty cycle to a sum of the first and second duty cycles, the second weight is 1 minus the first weight.

In some example embodiments, the first and second level RF pulse powers and the bias RF power may be provided in a pulse form, the first and second level RF pulse powers may be non-zero RF powers over time, and the bias RF power may include zero RF power portions over time.

In some example embodiments, the controller is configured to continuously adjust the impedance matching network may be configured to be continuously adjusted by the controller such that the reflection RF power is minimized throughout an entire plasma processing process.

In some example embodiments, the pulse plasma apparatus of may further include a synchronization device that is connected between the source RF generator and the bias RF generator and configured to synchronize the first duty cycle of the first level RF pulse power with the third duty cycle of the bias RF pulse power.

BRIEF DESCRIPTION OF THE DRAWINGS

Example embodiments of the inventive concepts will be more clearly understood from the following detailed description taken in conjunction with the accompanying drawings in which:

FIG. 6 is a control flow chart illustrating pulse plasma impedance matching according to an example embodiment of the inventive concepts.

DETAILED DESCRIPTION OF EMBODIMENTS

Figure 1:
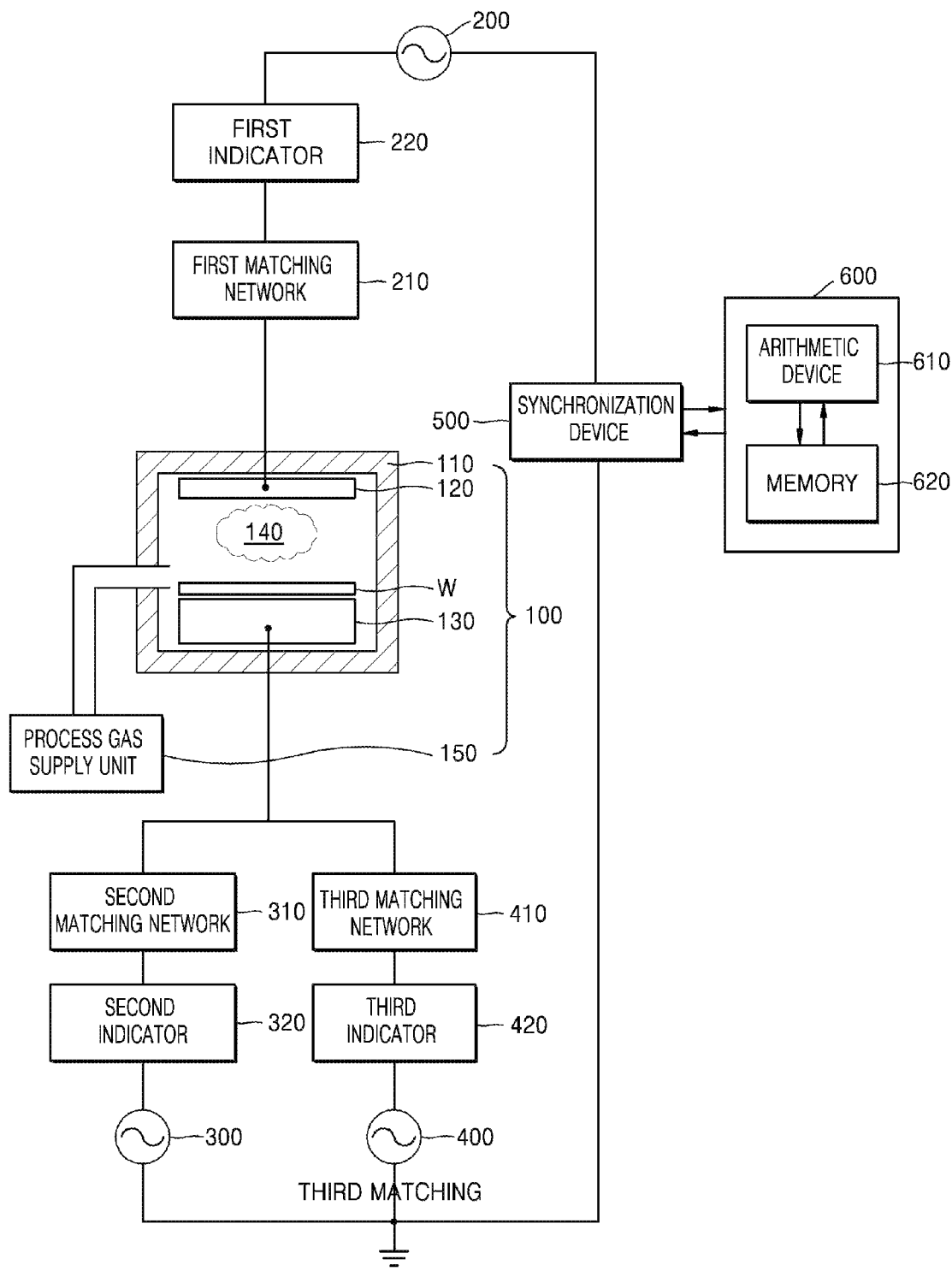
FIG. 1 is a schematic conceptual diagram of a pulse plasma apparatus according to an example embodiment of the inventive concepts.

The inventive concepts will be described more fully hereinafter with reference to the accompanying drawings, in which embodiments of the inventive concepts are shown. This inventive concepts may, however, be embodied in many different forms and should not be construed as limited to the example embodiments set forth herein. Rather, these example embodiments are provided so that this disclosure will be thorough and complete, and will fully convey the scope of the inventive concepts to those skilled in the art. In the drawings, the sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Meanwhile, spatially relative terms, such as "between" and "directly between" or "adjacent to" and "directly adjacent to" and the like, which are used herein for ease of description to describe one element or feature's relationship to another element(s) or feature(s) as illustrated in the figures, should be interpreted similarly.

It will be understood that, although the terms first, a second, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the inventive concepts.

As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of at least one other features, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The term rela,'he term re'body,o 'member,emberrm rel as used herein, means, but is not limited to, a software or hardware component, such as a Field Programmable Gate Array (FPGA) or Application Specific Integrated Circuit (ASIC), which performs certain tasks. A unit or module may advantageously be configured to reside on the addressable storage medium and configured to execute on one or more processors. Thus, a unit or module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and units or modules may be combined into fewer components and units or modules or further separated into additional components and units or modules.

Unless otherwise defined, all terms (including technical and scientific terms) used herein have the same meaning as commonly understood by one of ordinary skill in the art to which this inventive concepts belong.

Hereinafter, example embodiments of the inventive concepts will be described in detail with reference to the accompanying drawings.

FIG. 1 is a schematic conceptual diagram of a pulse plasma apparatus 1000 according to an example embodiment of the inventive concepts. The pulse plasma apparatus 1000 may mean an apparatus processing semiconductor wafer substrates by using pulsed plasma. In some example embodiments, a plasma pulsing process using a source radio frequency (RF) generator 200 and/or bias RF generators 300 and 400 may reduce trenching and/or notching and improve etching performance (e.g., uniformity, selectivity, etc.) with less damage in a wafer level.

Referring to FIG. 1, the pulse plasma apparatus 1000 may include a plasma process chamber 100, the source RF generator 200, a first matching network 210, a first indicator 220, a first bias RF generator 300, a second matching network 310, a second indicator 320, a second bias RF generator 400, a third matching network 410, a third indicator 420, a synchronization device 500, and a controller 600.

The plasma process chamber 100 may include a vacuum chamber 110, an upper electrode 120, a lower electrode 130, plasma 140, and a process gas supply unit 150. The upper electrode 120 may be disposed at an upper portion in the vacuum container 110, and the lower electrode 130 may be disposed at a low portion in the vacuum container 110. The lower electrode 130 may be disposed below the upper electrode 120. RF power supplied to the upper electrode 120 or the lower electrode 130 may be coupled to the plasma 140 or process gases supplied from the gas supply unit 150. In an example embodiment, the upper electrode 120 or the lower electrode 130 may inductively couple power to process gases that are supplied inside the vacuum container 110 by the process gas supply unit 150. The RF power, which is applied to the upper electrode 120 or the lower electrode 130, may be inductively coupled to the process gases to form the plasma 140 in a reaction region on a semiconductor wafer substrate W. The process gases supplied from the process gas supply unit 150 may etch materials on the semiconductor wafer substrate W. In an example embodiment, the process gas may include $C_xF_y$.

In an example embodiment, the RF power applied from the upper electrode 120 may ignite the plasma 140, and the RF power applied from the lower electrode 130 may control ion, radical or the like of the plasma 140.

Figure 2:
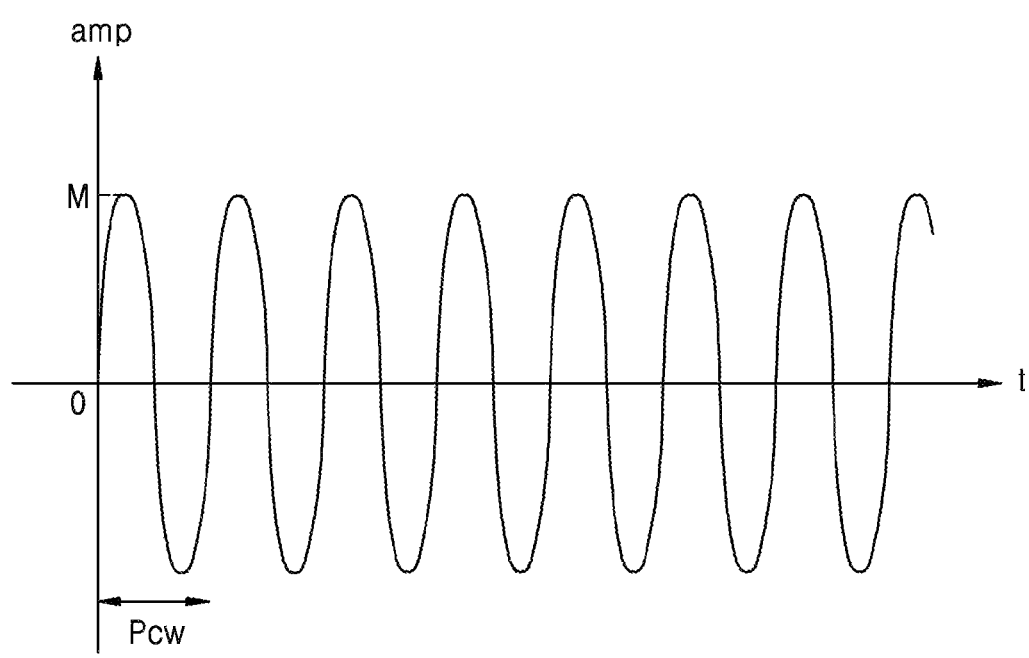
FIG. 2 is a diagram of continuous wave mode pulse plasma power generated in the pulse plasma apparatus with the passage of time according to an example embodiment of the inventive concepts.
Figure 3A:
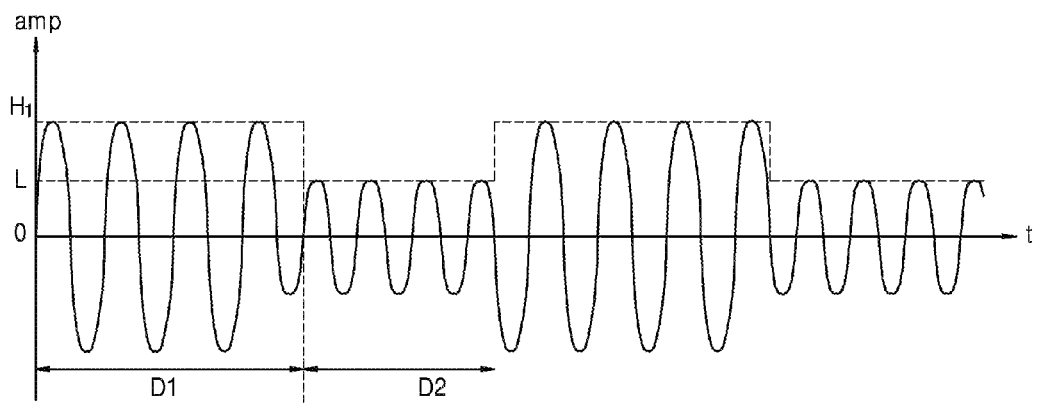
FIGS. 3A to 3C are diagrams of pulse plasma power generated in the pulse plasma apparatus with the passage of time according to an example embodiment of the inventive concepts.

The source RF generator 200 may supply first level RF power and second level RF power to the upper electrode 120 (see FIG. 3A). The first and second bias RF generators 300 and 400 may respectively supply third level RF power and fourth level RF power to the lower electrode 130 (see FIGS. 3B and 3C). At least one of the source RF generator 200, the first bias RF generator 300, and the second bias RF generator 400 may be configured to be adjusted in frequency at high speed. At least one of the source RF generator 200, the first bias RF generator 300, and the second bias RF generator 400 may be operated in a continuous wave mode (CW) or a pulse mode (see FIGS. 2 to 3C). The source RF generator 200 may be pulsed at a frequency of 100 MHz to 200 MHz when the source RF generator 200 is operated in the pulse mode. The first bias RF generator 300 may be pulsed at a frequency of 2 MHz to 100 MHz. The second bias RF generator 400 may be pulsed at a frequency higher than 0 MHz and equal to or lower than 2 MHz. At least one of the source RF generator 200, the first bias RF generator 300, and the second bias RF generator 400 may be operated at duty cycles (percentage of on time period from among the sum of on time and off time in a cycle) of 10% to 90% (see FIGS. 2 to 3C).

The first matching network 210 may minimize reflected power from the plasma process processing device 110. In order to minimize the reflected power, the first matching network 210 may identically match a plasma impedance of the plasma process chamber 100 with an impedance of the source RF generator 200. In an example embodiment, the reflected power may be minimized when a complex impedance of the plasma process chamber 100 and a complex impedance of the source RF generator 200 are matched to 50Ω. In an example embodiment, the first matching network 210 may minimize the reflected power by matching the complex impedance of the plasma process chamber 100 with the complex impedance of the source RF generator 200 to become 50Ω. Characteristics of the plasma 140 may be changed in the plasma process chamber 100 during plasma processing (e.g., etching) of the semiconductor wafer substrate W. Accordingly, in order to perform a smooth dynamic matching in accordance with changes in characteristics of the plasma 140, the first matching network 210 may be continuously adjusted to match the complex impedance of the plasma process chamber 100 with the complex impedance of the source RF generator 200 throughout the entire plasma processing process. A detailed description relating to a structure of the first matching network 210 and a matching method thereof will be described below. The second and third matching networks 310 and 410 may respectively match impedances of the first and second bias RF generators 300 and 400 with the plasma impedance of the plasma process chamber 100. A description relating to the second and third matching networks 310 and 410 will be omitted due to overlap with that relating to the first matching network 210.

The first indicator 220 may be connected to the first matching network 210 for matching a plasma impedance of the plasma process chamber 100 and the impedance of the source RF generator 200, and be used to improve a matching efficiency of the first matching network 210. In an example embodiment, the first indicator 220 may monitor and indicate the reflected power from the plasma process chamber 100. A signal corresponding to the reflected power may be transmitted from the first matching network 210 to the first indicator 220. In an example embodiment, the first indicator 220 may be integrated in the first matching network 210. The first indicator 220 may have a directional coupler that is coupled to a RF detector so that a validity display signal of the matching is a voltage representing a magnitude of the reflected power. The first indicator 220 may be connected to the controller 600 through the synchronization device 500.

The synchronization device 500 may synchronize an operation of one RF generator with an operation of another RF generator. In one example embodiment, the synchronization device 500 may synchronize an operating frequency by coupling the source RF generator 200 and the first and second bias RF generators 300 and 400 to each other. A detailed description of the synchronization will be described below in descriptions of FIGS. 3A to 3C.

The controller 600 may be connected to the synchronization device 500 and control the source RF generator 200, the first matching network 210, the first bias RF generator 300, the second matching network 310, the second bias RF generator 400, and the third matching network 410 through the synchronization device 500. For example, the controller 600 may measure reflected power from the first to third matching networks 210, 310 and 410, and judge whether the reflected power from the matching network is increased. When the controller 600 determines that the reflected power is increased, the controller 600 may adjust a capacitance or an inductance of the first matching network 210 so as to match the plasma impedance of the plasma process chamber 100 with the impedance of the source RF generator 200. A detailed description of a matching method passes through the first matching network 210 will be described below in descriptions of FIGS. 5 and 6.

The controller 600 may include hardware such as an arithmetic device 610 and a memory 620. The controller 600 may control and monitor the plasma processing (e.g., etching) process in the plasma process chamber 100 through interfaces. The interfaces may include an analog interface, a digital interface, a wired interface, a wireless interface, an optical interface, and/or an optical fiber based interface. The arithmetic device 610 may be a processor which may be used to control sub-processors and the plasma process chamber 100. The memory 620 may be coupled to the arithmetic device 610. The memory 620 may include at least one of a random access memory (RAM), a read only memory (ROM), a floppy disc, a hard disc, or a local or a remote digital storage device in any different form. The controller 600 may be a central processing unit (CPU), or an application-specific integrated circuit (ASIC), that when, executing instructions stored in controller 600 (for example a calculation algorithm stored in the arithmetic device 610 as described later in this application or in the memory 620), configures the controller 600 as a special purpose controller to perform the operations controlled by the arithmetic device 610 of the controller 600. The controller 600 may improve the functioning of a pulse plasma apparatus itself by controlling hardware for performing impedance matching and/or reducing reflected power from the process chamber 100.

FIG. 2 is a diagram of continuous wave mode RF plasma power generated in the pulse plasma apparatus 1000 with the passage of time according to an example embodiment of the inventive concepts.

Referring to FIG. 2, the continuous wave mode RF plasma power may be generated by a voltage wave in a sine wave form having a period ($P_{CW}$). The absolute value of a magnitude of the continuous wave mode RF plasma power may have a maximum value M and a minimum value 0. The maximum value M of the source RF generator 200 may be smaller than those of the first and second bias RF generators 300 and 400 (see FIG. 1). That is, the maximum value of the continuous wave mode RF plasma power generated in the source RF generator 200 may be smaller than those of the RF powers generated in the first and second bias RF generators 300 and 400.

As described in FIG. 2, when the continuous wave mode RF plasma power is applied to the plasma process chamber 100 (see FIG. 1), and thus the semiconductor wafer substrate W (see FIG. 1) is, for example, etched, selectivity of etching may not be desirable because not only the ions in the plasma, but also the radical or an electron participates in the etching process. Therefore, recently a plasma process (e.g., etching process) supplying pulse-form RF power has been widely used to expand a process region and to increase a process margin. When the semiconductor wafer substrate W is etched by supplying the pulse-form RF power to the plasma process chamber 100, the pulse-form RF power may help obtain a relatively higher selectivity compared to the continuous wave mode RF plasma power, and may prevent or mitigate problems, for example, charging damage, UV radiation, and/or physical sputtering, which may occur during the plasma processing.

Figure 3B:
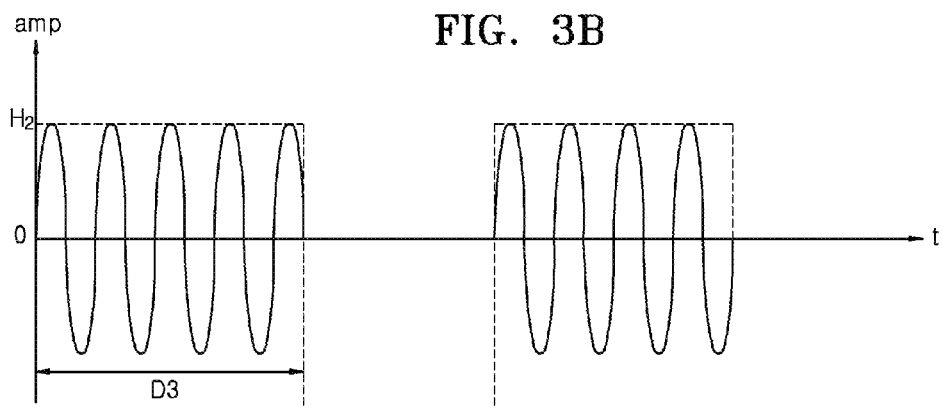
Figure 3C:
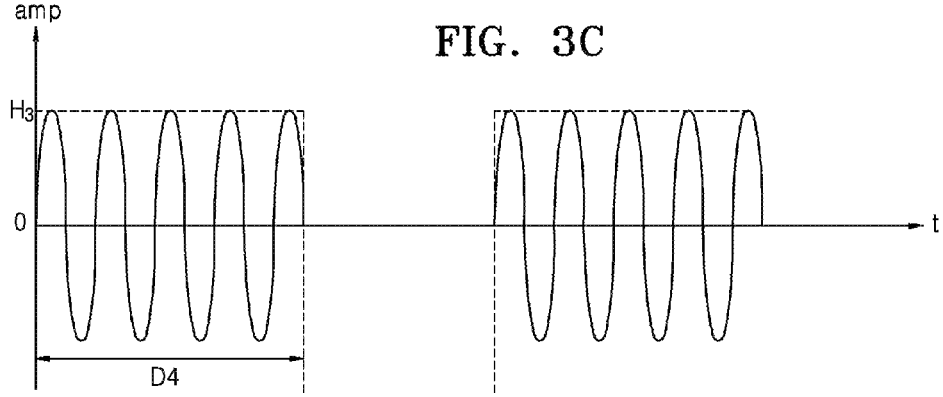

FIGS. 3A to 3C are diagrams of pulse plasma RF power which generated in the pulse plasma apparatus 1000 with the passage of time according to an example embodiment of the inventive concepts. For example, FIG. 3A illustrates RF pulse power which generated in the source RF generator 200 (see FIG. 1) with the passage of time, FIG. 3B illustrates RF pulse power which generated in the first bias RF generator 300 (see FIG. 1) with the passage of time, and FIG. 3C illustrates RF pulse power which generated in the second bias RF generator 400 (see FIG. 1) with the passage of time.

Referring to FIG. 3A, the source RF generator 200 may generate first level RF pulse power having a first duty cycle D1 and second level RF pulse power having a second duty cycle D2, and supply the first level RF pulse power and the second level RF pulse power to the upper electrode 120 (see FIG. 1). The first and second duty cycles D1 and D2 may be an identical time period or mutually different time periods. The maximum value $H_1$ of the first level RF pulse power may be greater than the maximum value L of the second level RF pulse power. The first and second level RF pulse powers may be RF pulse powers having a non-zero positive value.

Referring to FIG. 3B, the first bias RF generator 300 may supply third level RF pulse power having a third duty cycle D3 to the lower electrode 130 (see FIG. 1). In an example embodiment, the third duty cycle D3 may be the same at the first duty cycle D1. In an example embodiment, the synchronization device 500 (see FIG. 1) may synchronize the first bias RF generator 300 with the source RF generator 200 at the first duty cycle D1. During the second duty cycle D2, the first bias RF generator 300 may supply RF power of 0 (meaning that the first bias RF generator 300 may not supply RF power to the lower electrode 130). The maximum value $H_2$ of the third level RF pulse power may be greater than the maximum value $H_1$ of the first level RF pulse power.

Referring to FIG. 3C, the second bias RF generator 400 may supply fourth level RF pulse power having a fourth duty cycle D4 to the lower electrode 130 (see FIG. 1). In an example embodiment, the fourth duty cycle D4 may be the same as the first and third duty cycles D1 and D3. In an example embodiment, the synchronization device 500 (see FIG. 1) may synchronize the second bias RF generator 400 with the source RF generator 200 and the first bias RF generator 300 at the first duty cycle D1. During the second duty cycle D2, the second bias RF generator 400 may supply RF power of 0 (meaning that the second bias RF generator 400 may not supply RF power to the lower electrode 130). The maximum value $H_3$ of the fourth level RF pulse power may be greater than the maximum value $H_1$ of the first level RF pulse power. The maximum value $H_3$ of the fourth level RF pulse power may or may not be greater than the maximum value $H_2$ of the third level RF pulse power.

Figure 4:
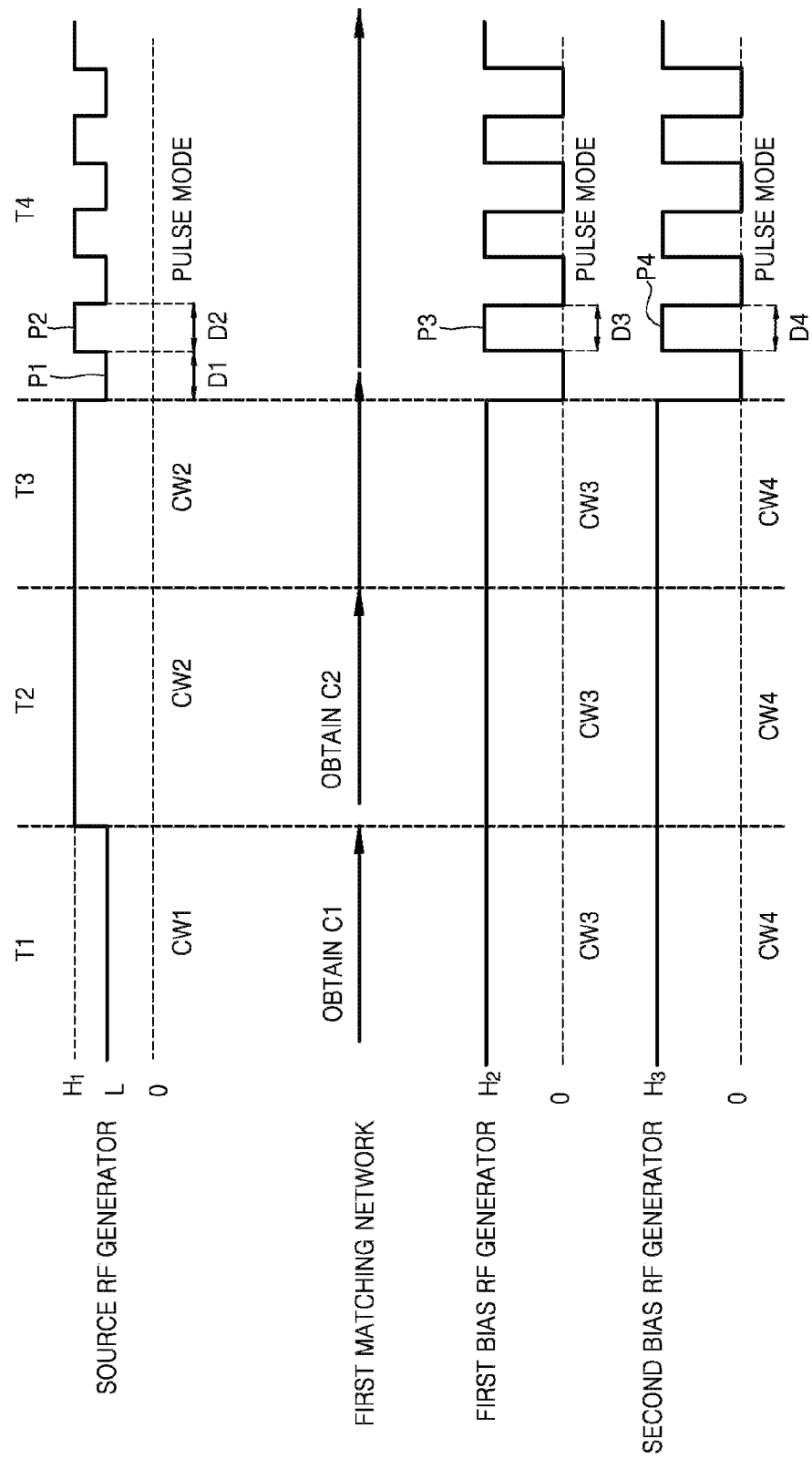
FIG. 4 is a diagram illustrating a synchronizing process of pulse plasma power generated in the pulse plasma apparatus according to pulse plasma impedance matching with the passage of time, according to an example embodiment of the inventive concepts.

FIG. 4 is a diagram illustrating a synchronizing process of pulse plasma RF power which generated in the pulse plasma apparatus 1000 according to pulse plasma impedance matching with the passage of time, according to an example embodiment of the inventive concepts.

Referring to FIG. 4, the source RF generator may supply first RF power CW1 in the continuous wave mode to the upper electrode 120 (see FIG. 1) during a first time period T1, and supply second RF power CW2 to the upper electrode 120 during second time period T2 and third time period T3. However, the first to third times T1, T2, and T3 shown as examples for description, may not be predetermined and may be optionally determined according to various example embodiments. In an example embodiment, the second RF power CW2 may be applied to the upper electrode 120 only during the second time period T2. The first and second RF powers CW1 and CW2 are sine waves in the continuous wave mode. FIG. 4 illustrates only the maximum values of the first and second RF powers CW1 and CW2 as straight lines, respectively, for convenience of description. The maximum value L of the first RF power CW1 may be smaller than the maximum value $H_1$ of the second RF power. The first bias RF generator may supply third RF power CW3 in the continuous wave mode to the lower electrode 130 (see FIG. 1) during the first to third times T1, T2, and T3. The second bias RF generator may supply fourth RF power CW4 in the continuous wave mode to the lower electrode during the first to third times T1, T2, and T3.

The first matching network may match the plasma impedance of the plasma process chamber 100 with the impedance of the source RF generator in order to minimize the reflected power from the plasma process chamber 100 (see FIG. 1) during the first time period T1. The controller 600 (see FIG. 1) connected to the first matching network may calculate a first matching capacitance value C1 that matches the plasma impedance of the plasma process chamber 100 with the impedance of the source RF generator. The first matching network may also match the plasma impedance of the plasma process chamber 100 with the impedance of the source RF generator during the second time period T2 and third time period T3. The controller 600 may calculate a second matching capacitance value C2 that matches the plasma impedance of the plasma process chamber 100 with the impedance of the source RF generator during the second time period T2 and third time period T3. A detailed description relating to an impedance matching algorithm of the first matching network and the controller 600 will be described below in descriptions of FIGS. 5 and 6.

The source RF generator may supply the pulse-form RF power to the upper electrode 120 (see FIG. 1) during a fourth time period T4. The source RF generator may alternately supply a plurality of the pulse-form RF powers (e.g., the first and second level RF pulse powers P1 and P2) that are non-zero to the upper electrode 120. The first level RF pulse power P1 may be applied to the upper electrode 120 at the first duty cycle D1, the second level RF pulse power P2 may be applied to the upper electrode 120 at the second duty cycle D2. When the source RF generator supplies the first and second RF pulse powers having mutually different levels to the upper electrode, an electron temperature and/or an electron density inside the plasma 140 (see FIG. 1) may be further controlled in comparison to the case in which the RF pulse power is applied during the first duty cycle D1, but is not applied during the second duty cycle D2. Thus, characteristics of the plasma 140 may be changed to be suitable for the plasma processing (e.g., etching) process. For example, ions and electrons of the plasma 140 may lose energy when the source RF generator does not supply the RF pulse power. The electron having a higher mobility than the ion may be damaged faster than the ion due to an ionization reaction and collision with a wall-surface of the plasma process chamber 100 (see FIG. 1), and thus may maintain a relatively low electron temperature $T_e$ on average compared to the case in which continuous wave mode RF plasma powers are supplied to the upper and lower electrodes 120 and 130. Therefore, a higher etching selectivity may be obtained by controlling a degree of dissociation and by increasing a ratio of $F/CF_2$, for example, in the plasma etching process using $C_xF_y$.

The first matching network 210 may be in a hold state, meaning that the first matching network 210 stops operation during the fourth time period T4.

The first bias RF generator may supply the third level RF pulse power to the lower electrode 130 (see FIG. 1) at the third duty cycle D3 during the fourth time period T4. In one example embodiment, the third duty cycle D3 may be the same as the second duty cycle D2. That is, the source RF generator may supply the second level RF pulse power to the upper electrode 120 while the first bias RF generator supplies the third level RF pulse power to the lower electrode 130. The first bias RF generator may supply pulse plasma power of 0 to the lower electrode 130 while the source RF generator supplies the first level RF pulse power to the upper electrode 120. That is, the first bias RF generator may not supply the RF power to the lower electrode 130 during the first duty cycle D1.

The second bias RF generator may supply the fourth level RF pulse power to the lower electrode 130 (see FIG. 1) during the fourth time as well as the first bias RF generator. The fourth level RF pulse power may be applied to the fourth duty cycle D4. In one example embodiment, the fourth duty cycle D4 may be the same as the second and third duty cycles D2 and D3. That is, the source RF generator and the first bias RF generator may respectively supply the second and third level RF pulse powers to the upper and lower electrodes 120 and 130 while the second bias RF generator supplies the fourth level RF pulse power to the lower electrode 130. The second bias RF generator may not supply the RF power to the lower electrode 130 while the source RF generator supplies the first level RF pulse power to the upper electrode 120.

Figure 5:
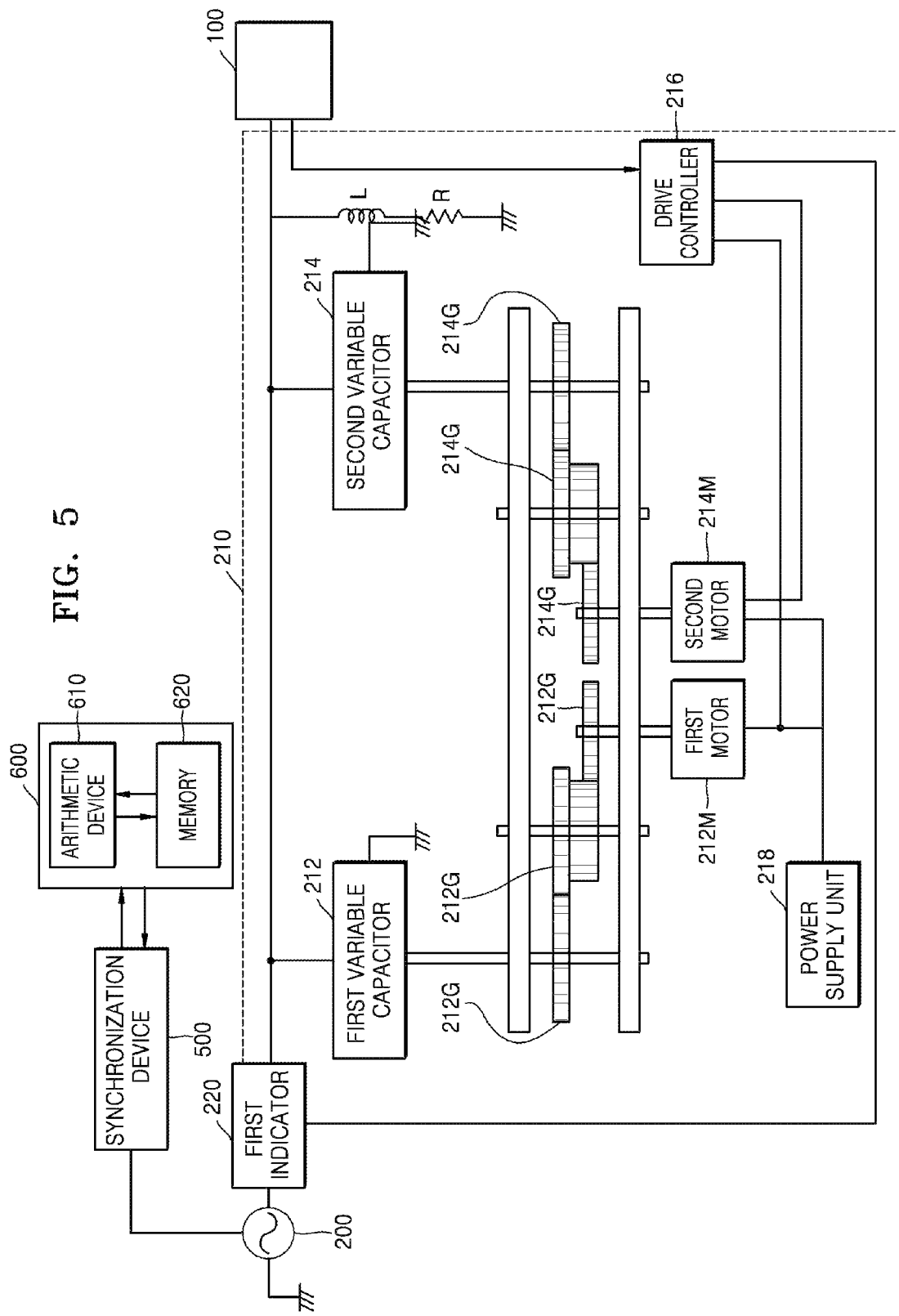
FIG. 5 is a configuration diagram of a pulse plasma impedance matching network according to an example embodiment of the inventive concepts.

FIG. 5 is a configuration diagram of a part of component of the pulse plasma apparatus 1000 according to an example embodiment of the inventive concepts, and FIG. 6 is a control flow chart illustrating impedance matching of the pulse plasma apparatus 1000.

Referring to FIGS. 5 and 6, the first matching network 210, the first indicator 220, the synchronization device 500 and the controller 600 may be used to match the plasma impedance of the plasma process chamber 100 with the impedance of the source RF generator 200. A control method of the impedance matching of the pulse plasma apparatus 1000 according to an example embodiment of the inventive concepts includes an operation S1001 in which the source RF generator 200 supplies the continuous wave mode RF power to the upper electrode after igniting the plasma, an operation S1002 in which the source RF generator 200 supplies the first RF power to the upper electrode 120 (see FIG. 1) during the first time, and the first matching network 210 outputs a first matching capacitance value, an operation S1003 in which the first matching capacitance value is stored in the memory 620, an operation S1004 in which the source RF generator 200 supplies the second RF power in the continuous wave mode to the upper electrode 120 during the second time, and the first matching network 210 outputs a second matching capacitance value, an operation S1005 in which the second matching capacitance value is stored in the memory 620, an operation S1006 in which an arithmetic device 610 calculates a third matching capacitance value by supplying a weight according to a ratio of the first and second duty cycles to the first and second matching capacitance values, an operation S1007 in which the controller 600 provides value information about the third matching capacitance value to the first matching network 210, and an operation S1008 in which the source RF generator 200 supplies the first level RF pulse power having the first duty cycle D1 and the second level RF pulse power having the second duty cycle D2 to the upper electrode 120.

The operation S1001 in which the source RF generator 200 supplies the continuous wave mode RF power to the upper electrode 120 (see FIG. 1). The operation S1002 in which the source RF generator 200 supplies the first RF power to the upper electrode 120 during the first time period T1 and the first matching network 210 outputs a first matching capacitance value, may be performed by operation of the first indicator 220 indicating the reflected power, which is applied from the source RF generator 200 to the upper electrode 120 but is reflected from the plasma process chamber 100, and the first matching network 210, which matches the plasma impedance of the plasma process chamber 100 with the impedance of the source RF generator 200.

For example, the first matching network 210 may include, a first variable capacitor 212 configured to control a coarse motion, a second variable capacitor 214 configured to control a fine motion, first and second motors 212M and 214M configured to output a first matching capacitance value C1 or a second matching capacitance value C2 by respectively rotating the first and second variable capacitors 212 and 214 in a forward direction or a reverse direction, a drive controller 216 configured to control drive of the first and second motors 212M and 214M, first and second gears 212G and 214G configured to transmit rotational power of the first and second motors 212M and 214M to the first and second variable capacitors 212 and 214, respectively, a power supply unit 218 configured to output a DC voltage, an inductor L for removing DC component of high frequency power outputted from the second variable capacitor 214, and a resistance R connected to the inductor L to detect a DC bias voltage. The first indicator 220 may indicate a value of the reflected power from the plasma process chamber 100 and transmit the value to the first matching network 210.

When the first RF power in the continuous wave mode is applied to the upper electrode 120 (see FIG. 1) in the plasma process chamber 100 during the first time period T1, the power supply unit 218 of the first matching network 210 may output a DC voltage by inputting AC power and dropping the voltage of the AC power. The first and second motors 212M and 214M may receive the DC voltage from the power supply unit 218, and rotationally drive in the forward direction or the reverse direction by a motor drive control signal. The drive controller 216 may output a drive signal of the first and second motors 212M and 214M in order to determine a capacitance value (e.g., the first matching capacitance value C1) to minimize the reflected power value indicated by the first indicator 220. In an example embodiment, when the plasma impedance of the plasma process chamber 100 is matched with the impedance of the source RF generator 200 to 50Ω, the reflected power may be minimized. As a result, the first and second motors 212M and 214M may respectively rotate the first and second gears 212G and 214G to the left or the right in order to perform the impedance matching to 50Ω by a motor drive control signal of the controller 216. The first and second gears 212G and 214G may respectively transmit the rotational power of the first and second motors 212M and 214M to the first and second variable capacitors 212 and 214. The first matching capacitance value C1 may be defined as a combination of a capacitance value of the first and second variable capacitors 212 and 214 when the reflected power becomes the minimum. The first matching capacitance value C1 may include all information about the capacitance values of the first and second variable capacitors 212 and 214. The inductor L may remove the DC component of the high frequency power outputted from the second variable capacitor 214. The high frequency power that is impedance matched through the inductor L may be supplied to the plasma process chamber 100.

The first matching capacitance value C1 determined in the first matching network 210 may be stored in the memory 620 in the controller 600 (S1003). The memory 620 is the same as the memory 620 in FIG. 1, and may be at least one of a random access memory (RAM), a read only memory (ROM), a floppy disc, a hard disc, or a local or a remote digital storage device in any different form.

When the source RF generator 200 supplies the second RF power in the continuous wave mode to the upper electrode 120 (see FIG. 1) in the plasma process chamber 100 during the second time period T2, the first matching network 210 may output the second matching capacitance value C2 as described above (S1004). That is, the power supply unit 218 may supply the DC voltage to the first and second motors 212M and 214M, the controller 216 may transmit the motor drive control signal to the first and second motors 212M and 214M to determine the capacitance value minimizing the reflected power value indicated by the first indicator 220, and the second matching capacitance value C2 may be determined by variation of the first and second variable capacitors 212 and 214 by the first and second motors 212M and 214M. When the second RF power is applied to the upper electrode 120, the second matching capacitance value C2 may be defined as the combination of the capacitance value of the first and second variable capacitors 212 and 214 when the reflected power becomes the minimum. The second matching capacitance value C2 may include all information about the capacitance values of the first and second variable capacitors 212 and 214.

The second matching capacitance value C2 may be stored in the memory 620 (S1005).

The arithmetic device 610 in the controller 600 may calculate a third matching capacitance value C3 by combining the first matching capacitance value C1 with the second matching capacitance value C2 that are outputted from the first matching network 210 and stored in the memory 620. The third matching capacitance value C3 may be calculated by combining the first matching capacitance value C1 with the second matching capacitance value C2 according to the ratio of the first and second duty cycles. Referring to FIG. 4, the first duty cycle D1 may be defined as a time during which the first level RF pulse power P1 is applied, and the second duty cycle D2 may be defined as a time during which the second level RF pulse power P2 is applied. The third matching capacitance value C3 may be calculated by the following Equations.

$$C_3 = a \times C_1 + (1-a) \times C_2 \quad \text{[Equation 1]}$$

$$a = \frac{D1}{D1 + D2} \quad \text{[Equation 2]}$$

Referring to Equations 1 and 2, the third matching capacitance value C3 may be obtained by multiplying the first matching capacitance value C1 by a weight a, that is, a ratio of the first duty cycle D1 to the sum of the first and second duty cycles D1 and D2, and multiplying the second matching capacitance value C2 by a weight (1−a). For example, when the weight a is 0.2, a capacitance value of the first variable capacitor 212 of the third matching capacitance value C3 may be calculated when a capacitance value of the first variable capacitor 212 of the first matching capacitance value C1 is multiplied by 0.2, and a capacitance value of the first variable capacitor 212 of the second matching capacitance value C2 is multiplied by 0.8. The third matching capacitance value C3 of the second variable capacitor 214 may also be calculated by the above method. In an example embodiment, the weight a may be 0.5. Because that the weight a is 0.5 means that the first duty cycle D1 and the second duty cycle D2 are identical to each other, the third matching capacitance value C3 may be an intermediate value (e.g., an average value) of the first and second matching capacitance values C1 and C2.

For example, the above calculation method or the control algorithm may be stored in the arithmetic device 610 in the controller 600 in a software routine form. The software routine may be performed by a hardware controlled by the arithmetic device 610. Thus, according to some example embodiments, the above calculation method and/or the control algorithm may be implemented as software, and may be executed in a computer system, a custom integrated circuit, or different types of hardware. According to some example embodiments, the above calculation method and/or the control algorithm may be performed by a hard-wired circuit or by using both the hard-wired circuit and a processor executing at least a portion of the algorithm. For example, as discussed above, the controller 600 may be a central processing unit (CPU), or an application-specific integrated circuit (ASIC), that is a special purpose controller configured to perform the above calculation method and/or control algorithm. An effect of reducing the reflected power from the plasma process chamber 100 may be substantially improved when the above impedance matching method is used. Accordingly, process variation may decrease, thereby obtaining more reproducible results. When an unstable waveform of power is continuously applied until the impedance of the source RF generator 200 and the plasma impedance of the plasma process chamber 100 are matched to each other, some of the power may be reflected from the plasma process chamber 100. Thus, process variation may increase during the time at which the reflected power is not mitigated.

The first matching network 210 may provide the value information about the third matching capacitance value C3 to the source RF generator 200 by calculating and outputting the third matching capacitance value C3 from the arithmetic device 610 in the controller 600 (S1007).

The source RF generator 200 may alternately supply the first level RF pulse power having the first duty cycle D1 and the second level RF pulse power having the second duty cycle D2 to the upper electrode 120 (see FIG. 1).

The synchronization device 500 may synchronize pulse plasma power that is applied to the upper electrode 120 by the source RF generator 200 with pulse plasma power that is applied to the lower electrode 130 by the first and second bias RF generators. Referring to FIGS. 4 and 6, the first and second bias RF generators may respectively supply third and fourth level RF pulse powers P3 and P4 to the lower electrode 130 (see FIG. 1) while the second level RF pulse power P2 having the second duty cycle D2 is applied to the upper electrode 120. Further, during the first duty cycle D1, the first and second bias RF generators may not supply the RF pulse power. However, the example embodiments mentioned above are provided only as examples. In some example embodiments, the first and second bias RF generators may respectively supply the third and fourth level RF pulse powers to the lower electrode 130 during the first duty cycle D1, and may not supply the pulse plasma power during the second duty cycle D2.

While the inventive concepts has been particularly shown and described with reference to some example embodiments thereof, it will be understood that various changes in form and details may be made therein without departing from the spirit and scope of the following claims.

What is claimed is:

1. A pulse plasma apparatus comprising:
a process chamber including an upper electrode and a lower electrode;
a source RF generator configured to supply first level RF pulse power and second level RF pulse power, the first level RF pulse power having a first duty cycle to the upper electrode, and the second level RF pulse power having a second duty cycle to the upper electrode;
a reflected power indicator configured to indicate reflection RF power, the reflection RF power being RF power re-reflected from the process chamber to the source RF generator;
a first matching network configured to match a plasma impedance of the process chamber with an impedance of the source RF generator as a first matching capacitance value when the first level RF pulse power is supplied, and match the plasma impedance of the process chamber with the impedance of the source RF generator as a second matching capacitance value when the second level RF pulse power is supplied; and
a controller configured to calculate a third matching capacitance value based on the first matching capacitance value, the second matching capacitance value and a ratio of the first and second duty cycles, provide the third matching capacitance value to the first matching network, and control the source RF generator and the first matching network.

2. The pulse plasma apparatus of claim 1, wherein the first level RF pulse power has a smaller value than the second level RF pulse power.

3. The pulse plasma apparatus of claim 1, wherein
the first and second duty cycles are identical to each other, and
the controller is configured to calculate an intermediate value of the first and second matching capacitance values as the third matching capacitance value.

4. The pulse plasma apparatus of claim 1, further comprising:
a first bias RF generator configured to supply third level RF pulse power to the lower electrode; and
a synchronization device connected to the source RF generator and the first bias RF generator, and configured to synchronize the first duty cycle of the first level RF pulse power with a duty cycle of the third level RF pulse power.

5. The pulse plasma apparatus of claim 4, wherein the synchronization device is configured to control the first bias RF generator such that the third level RF pulse power is not supplied to the lower electrode while the source RF generator supplies the first level RF pulse power to the upper electrode at the first duty cycle, and
the synchronization device is configured to perform duty cycle synchronization by supplying the third level RF pulse power to the lower electrode at the second duty cycle while the source RF generator supplies the second level RF pulse power to the upper electrode at the second duty cycle.

6. The pulse plasma apparatus of claim 4, further comprising:
a second bias RF generator configured to be connected to the lower electrode, and supply fourth RF pulse power, the fourth RF pulse power having a lower frequency than the third level RF pulse power to the lower electrode.

7. The pulse plasma apparatus of claim 6, wherein the source RF generator is configured to supply the first and second level RF pulse powers at a frequency of 100 MHz to 200 MHz,
the first bias RF generator is configured to supply the third level RF pulse power at a frequency of 2 MHz to 100 MHz,
the second bias RF generator is configured to supply fourth level RF power at a frequency of 0 MHz to 2 MHz.

8. The pulse plasma apparatus of claim 1, wherein the controller comprises:
a memory configured to store the first and second matching capacitance values; and
an arithmetic device configured to perform an algorithm that assigns a weight to the first and the second matching capacitance values according to the ratio of the first and second duty cycles, and calculates the third matching capacitance value that matches the plasma impedance of the process chamber with the impedance of the source RF generator.

9. A drive control method of a pulse plasma apparatus comprising:
supplying first RF power in a continuous wave mode to an upper electrode of a process chamber by a source RF generator during a first time period;
determining a first matching capacitance value so as to match a plasma impedance of the process chamber with an impedance of the source RF generator;
supplying second RF power in the continuous wave mode to the upper electrode by the source RF generator during a second time period;
determining a second matching capacitance value so as to match the plasma impedance of the process chamber with the impedance of the source RF generator;
calculating a third matching capacitance value by a controller based on the first matching capacitance value and the second matching capacitance value;
transmitting the third matching capacitance value to the first matcher by the controller; and
alternately supplying first level RF pulse power having a first duty cycle and second level RF pulse power having a second duty cycle to the upper electrode by the source RF generator.

10. The method of claim 9, wherein the calculating a third matching capacitance comprises:
calculating a ratio of the first and second duty cycles; and
calculating the third matching capacitance value by applying weights according to the ratio to the first and second matching capacitance values, respectively.

11. The method of claim 9, further comprising:
storing the first matching capacitance values in a memory; and
storing the second matching capacitance values in the memory.

12. The method of claim 9, wherein the supplying first RF power by the source RF generator comprises supplying third RF power to a lower electrode of the process chamber during the first time period by a first bias RF generator connected to the lower electrode.

13. The method of claim 12, wherein the supplying first RF power by the source RF generator comprises supplying fourth RF power to the lower electrode during the first time period by a second bias RF generator connected to the lower electrode.

14. The method of claim 12, further comprising:
synchronizing the supplying of the first and third RF powers to the upper electrode and the lower electrode at the first and second duty cycles.

15. The method of claim 14, wherein RF pulse power is not supplied to the lower electrode while the first level RF pulse power having the first duty cycle is supplied to the upper electrode, and the third level RF pulse power having the second duty cycle is supplied to the lower electrode while the second level RF pulse power having the second duty cycle is supplied to the upper electrode.

16. A pulse plasma apparatus comprising:

a process chamber including an upper electrode and a lower electrode;

a source RF generator configured to supply source RF powers to the upper electrode, the source RF powers including first RF power in a continuous wave form during a first time period, second RF power in a continuous waver form during a second time period, and the first and second level RF pulse powers supplied in an alternating manner during a third time period, the first level RF pulse power having a first duty cycle, the second level RF pulse power having a second duty cycle, the third time period following the second time period, the second time period following the first time period;

a bias RF generator configured to supply bias RF power to the lower electrode, the bias RF power having a third duty cycle;

a reflected power indicator configured to indicate reflection RF power, the reflection RF power being RF power reflected from the process chamber;

an impedance matching network configured to match a plasma impedance of the process chamber with an impedance of the source RF generator during the first time period and during the second time period; and a controller configured to, calculate first and second matching capacitance values that match the plasma impedance of the plasma process chamber with the impedance of the source RF generator during the first and second time periods, respectively, calculate a third matching capacitance value based on the first and second matching capacitance values, and the first and second duty cycles, and control the impedance matching network based on the third matching capacitance value.

17. The pulse plasma apparatus of claim 16, wherein the controller is configured to calculate the third matching capacitance by combining the first matching capacitance value multiplied by a first weight with the second matching capacitance value by a second weight, where the first weight is a ratio of the first duty cycle to a sum of the first and second duty cycles, and the second weight is 1 minus the first weight.

18. The pulse plasma apparatus of claim 16, wherein the first and second level RF pulse powers and the bias RF powers are provided in a pulse form, the first and second level RF pulse powers are non-zero RF powers over time, and the bias RF power includes zero RF power portions over time.

19. The pulse plasma apparatus of claim 16, wherein the controller is configured to continuously adjust the impedance matching network.

20. The pulse plasma apparatus of claim 16, further comprising:

a synchronization device connected between the source RF generator and the bias RF generator, and configured to synchronize the first duty cycle of the first level RF pulse power with the third duty cycle of the bias RF pulse power.

* * * * *